United States Patent [19]
Chen et al.

[11] Patent Number: 5,821,201
[45] Date of Patent: Oct. 13, 1998

[54] (BI, PB)$_2$, SR$_2$CA$_2$CU$_3$O$_X$ SUPERCONDUCTOR AND METHOD OF MAKING SAME UTILIZING SINTER-FORGING

[75] Inventors: Nan Chen; Kenneth C. Goretta, both of Downers Grove; Michael T. Lanagan, Woodridge, all of Ill.

[73] Assignee: The United States of America as represented by the United States Department of Energy, Washington, D.C.

[21] Appl. No.: 748,259

[22] Filed: Nov. 13, 1996

Related U.S. Application Data

[63] Continuation of Ser. No. 225,110, Apr. 8, 1994, abandoned.
[51] Int. Cl.$^6$ .......................... C04B 35/626; C04B 35/645
[52] U.S. Cl. .......................... 505/432; 505/433; 505/450; 505/739
[58] Field of Search .......................... 252/521; 505/432, 505/433, 450, 725, 739, 742

[56] References Cited

U.S. PATENT DOCUMENTS

| 5,189,011 | 2/1993 | Itozaki et al. | 505/1 |
| 5,273,956 | 12/1993 | Johnson et al. | 505/100 |

OTHER PUBLICATIONS

Tampieri et al "Densification of Bi$_{1.8}$(Pb)$_{.35}$Sr$_{1.9}$Ca$_{2.1}$Cu$_3$O$_x$..." *JJAP*, Part 1 (1993) 32(10) pp. 4490–4495, (No Month).

Chen et al "Sinter–Forged (Bi, Pb)$_2$Sr$_2$Ca$_2$Cu$_3$O$_x$ . . . " *Supercond. Sci Technol.* 6(1993) 674–677 (No Month).

Yang et al "Alignment of grains in Bi$_{1.6}$Pb$_4$Sr$_2$Ca$_2$Cu$_3$O$_x$ . . . " *Supercond. Sci. Technol.* 6(1993) 269–275. (No Month).

Jin et al "The Specific Heat of the Single–Phase (Bi, Pb)$_2$Sr$_2$Ca$_2$Cu$_3$O$_{10xy}$ . . . " *Physica C.* vol. 158, 1989 pp. 255–257.

Che et al "Composition & Superconductivity in Bi—Sr—Ca—Cu—O . . . " Journal of Materials Science, vol. 24, May 1989, pp. 1725–1728.

Lusk et al "High Pressure Studies of the Superconducting Transition in (Bi,Pb)$_2$Sr$_2$Ca$_2$Cu$_3$O$_{10}$" Aust. J. Phys, vol. 42, #4, 1989 pp. 425–429.

Robinson et al "Sinter–Forged YB$_2$Cu$_3$O$_{7-8}$" Ad. Cer. Materials, vol. 2, #3B, Special Issue Jul.,1987, pp. 380–388.

Yamada et al "Pb Introduction to the High–Tc Superconductor . . . " J.J.A.P. vol. 27, No. 6, Jun. 1988 pp. 1996–1998.

Jin et al "High–Tc Superconductors–composite wire fabrication" Appl. Phys. Lett. Vol. 51(3) Jul. 1987 pp. 203–204.

*Primary Examiner*—Paul Lieberman
*Assistant Examiner*—Mark Kopec
*Attorney, Agent, or Firm*—Daniel D. Park; Thomas G. Anderson; William R. Moser

[57] ABSTRACT

A (BiPb)$_2$Sr$_2$Ca$_2$Cu$_3$O$_x$(Bi223) superconductor with high J$_c$, phase purity, density and mechanical strength is formed from Bi2223 powder which is synthesized from a mixture of Bi$_2$O$_3$, PbO, SrCO$_3$, CaCo$_3$ and CuO. The mixture is milled, then dried and calcined to synthesize the Bi2223 powder with the desired phase purity. The calcination is performed by heating the dried mixture for 50 hours at 840° C. The partially synthesized powder is then milled for 1–4 hours before calcining further for another 50 hours at 855° C. to complete the synthesis. After calcination, the Bi2223 powder is cold pressed to a predetermined density and sinter forged under controlled temperature and time to form a Bi2223 superconductor with the desired superconducting properties.

17 Claims, 3 Drawing Sheets

FIGS. 2a, b, c

(BI, PB)$_2$, SR$_2$CA$_2$CU$_3$O$_X$ SUPERCONDUCTOR AND METHOD OF MAKING SAME UTILIZING SINTER-FORGING

This application is a continuation of application Ser. No. 08/225,110 filed Apr. 8 1994, now abandoned.

CONTRACTUAL ORIGIN OF THE INVENTION

The United States Government has rights in this invention pursuant to Contract No. W-31-109-ENG-38 between the U.S. Department of Energy and the University of Chicago.

BACKGROUND OF THE INVENTION

The present invention relates to a method of manufacturing high temperature superconductors, and, more particularly, to an efficient method of manufacturing a (BiPb)$_2$Sr$_2$Ca$_2$Cu$_3$O$_x$ superconductor which has a high critical current density ($J_c$), phase purity, density and mechanical strength.

Copper oxide ceramics have shown great potential for application as high temperature superconductors. Of these, the bismuth series (Bi,Pb)SrCaCuO (BSCCO) superconductor has received considerable attention because of its relatively high transition, or critical temperature ($T_c$). However, the BSCCO superconductor, having a multi-phase character and being formed from ceramic powder, has been difficult to process into a dense, phase pure ceramic oxide with strong mechanical properties.

A well known method of synthesizing BSCCO superconductors is the sinter forging process which has produced fairly strong and phase pure superconductors. The process typically involves mixing and calcinating precursor powders at high temperatures and then sinter forging the mixture under carefully controlled pressure and temperature. The process, however, has not produced a BSCCO superconductor with a high enough $J_c$ to make it effective for large scale superconducting applications. It is estimated that large scale high temperature superconductor applications require $J_c$ values of about $10^4$ amps per square centimeter (A/cm$_2$) in the magnetic field associated with the application. Additionally, lengthy and costly annealing is usually required to remove microscopic defects and achieve good phase purity. Generally, the annealing itself can take up to 10 days at temperatures ranging from 830° to 870° C.

In view of the foregoing, the general object of this invention is to provide a method of manufacturing BSCCO superconductors with a high $J_c$, Another object of this invention is to provide a method of manufacturing BSCCO superconductors without the need for lengthy and costly annealing.

Yet another object of this invention is to provide a method of manufacturing BSCCO superconductors with high density and mechanical strength.

An additional object of this invention is to provide a BSCCO superconductor with high $J_c$, phase purity, and density.

A further object of this invention is to provide a BSCCO superconductor with high strength and fracture toughness.

A still further object of this invention is to provide a BSCCO superconductor with integral low-resistance silver contacts capable of carrying large currents.

Additional objects, advantages and novel features of the invention will become apparent to those skilled in the art upon examination of the following and by practice of the invention.

SUMMARY OF THE INVENTION

To achieve the foregoing and other objects, this invention provides a high temperature (BiPb)$_2$Sr$_2$Ca$_2$Cu$_3$O$_x$ (Bi2223) superconductor with high $J_c$, phase purity, density and mechanical strength, and a method of manufacturing the same. The Bi2223 superconductor is formed from Bi2223 powder which is synthesized from a mixture of Bi$_2$O$_3$, PbO, SrCO$_3$, CaCo$_3$ and CuO. The mixture is milled, then dried and calcined to synthesize the Bi2223 powder with the desired phase purity. The calcination is performed by heating the dried mixture for 50 hours at 840° C. The partially synthesized powder is then milled for 1–4 hours before calcining further for another 50 hours at 855° C. to complete the synthesis. The milling step, conducted at the midpoint of the calcination, helps to improve the phase purity of the Bi2223 powder and reduce the coarse nonsuperconducting phases. After calcination, the Bi2223 powder is cold pressed to a predetermined density and sinter forged under controlled temperature and time to form a Bi2223 superconductor with the desired superconducting properties.

BRIEF DESCRIPTION OF THE DRAWINGS

The present invention is illustrated in the accompanying drawings where.

DESCRIPTION OF THE PREFERRED EMBODIMENT

The invention is directed to an efficient method of manufacturing high temperature (Bi,Pb)$_2$Sr$_2$Ca$_2$Cu$_3$O$_x$(Bi2223) superconductors (where 9.5<x<10.5) with high $J_c$, phase purity, density and strength, and with low-resistance silver contacts. In the preferred embodiment of the invention described herein, a Bi2223 superconductor is formed from Bi2223 powder, which is synthesized from a mixture of Bi$_2$O$_3$,PbO, SrCO$_3$, CaCo$_3$ and CuO. The mixture is placed in polyethylene jars with ZrO$_2$ grinding media and isopropyl alcohol and is ballmilled for about 16 hours. The nixture is then dried and calcined in an Al$_2$O$_3$ crucible to synthesize Bi2223 powder to the desired phase purity.

The calcination is performed by heating the dried mixture in dry, CO$_2$-free air for 50 hours at 840° C. The partially synthesized powder is then further milled by vibratory ball-milling for 1–4 hours. Finally, the milled, partially synthesized powder is again heated for 50 hours at 855° C. to complete the synthesis. The calcination, as described herein, differs from conventional calcination in that a step of vibratory ball-milling is added halfway through the heating cycle. The vibratory ball-milling not only improves the $J_c$ of the resulting Bi2223 superconductor, but also renders unnecessary a final annealing step that generally takes longer than 100 hours.

Figure 1:
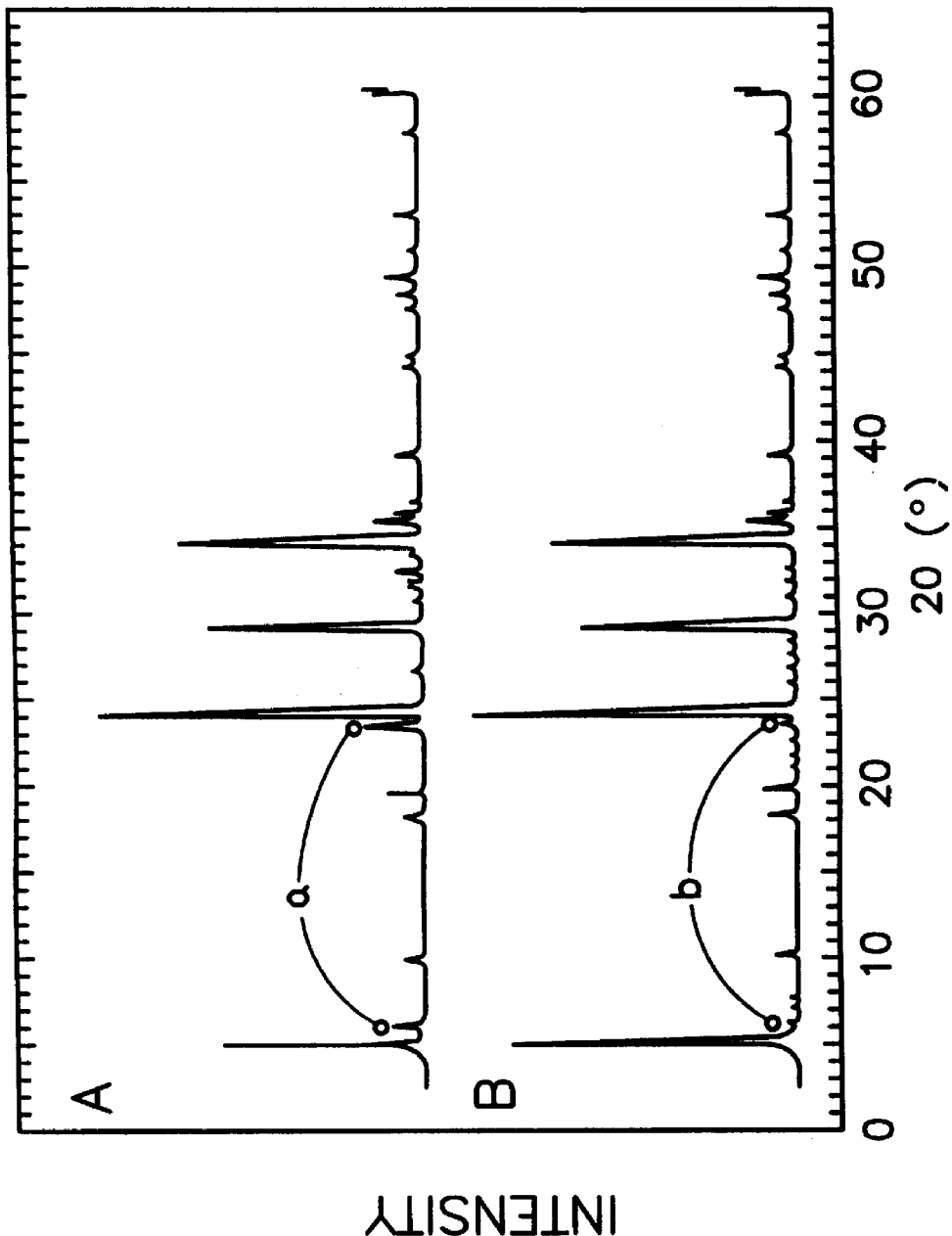
FIG. 1 is a comparison of two x-ray diffraction patterns showing the content of Bi2212 in a conventionally prepared superconductor shown by pattern A and in a superconductor prepared by the method of the invention shown by pattern B.

As it is known in the art, the synthesis of Bi2223 powder is a slow, kinetically limited process that forms Bi$_2$Sr$_2$CaCu$_2$O$_x$ (Bi2212) as an intermediate phase. To obtain good superconducting properties, however, the amount of the Bi2212 phase in the final product must be minimized. As shown in FIG. 1, the x-ray diffraction patterns, A and B, demonstrate that the amount of the Bi2212 phase, as indicated by the Bi2212 peaks marked by the dots, a and b, is lower in the Bi2223 superconductor formed by the method of the invention, shown by pattern B, than that produced by conventional methods, shown by pattern A. Conductivity tests show that superconductors formed from the conventionally synthesized powder, typically produces $J=2000$ A/cm$^2$ at 77 K, while superconductors produced from the powder synthesized by the method of the invention, produced a $J_c \approx 8000$ A/cm$^2$ at the same temperature.

Figure 2:
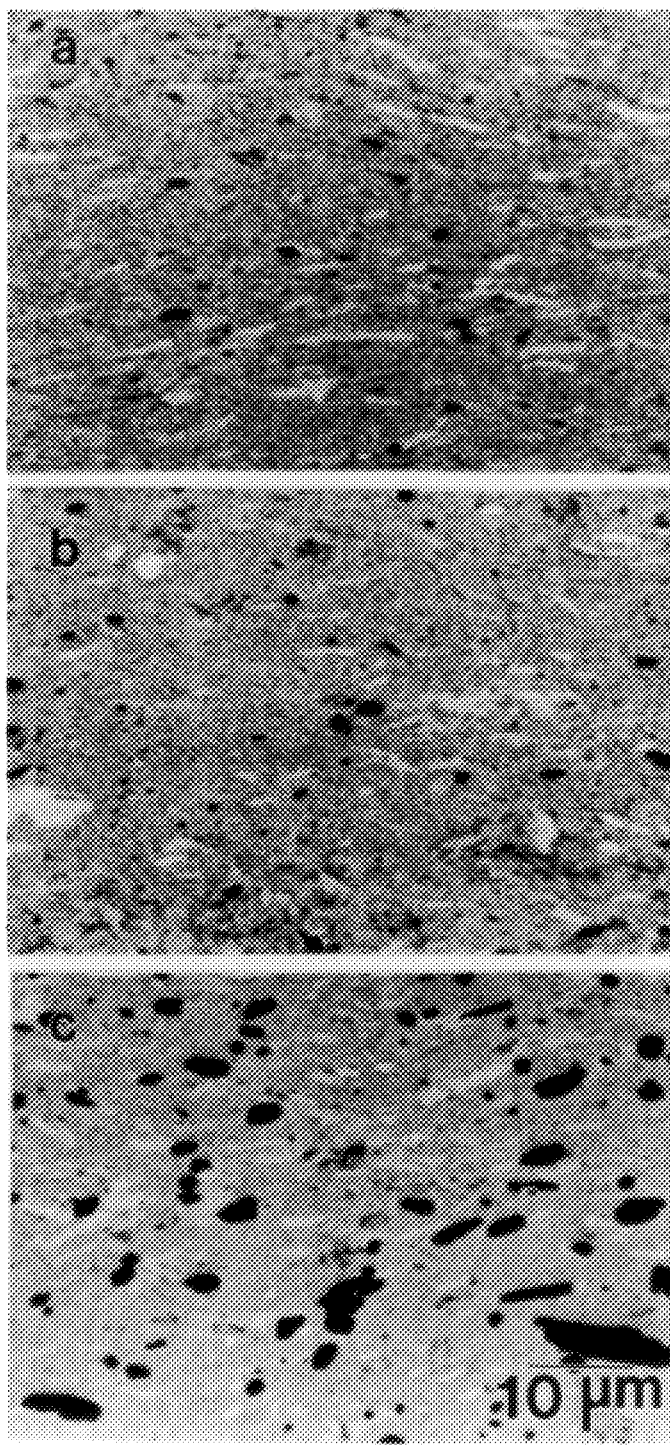
FIGS. 2a–2c are micrographs of the Bi2223 superconductor showing evidence of a liquid phase which has percolated downward during the sinter forging process.

Additionally, along with the Bi2223 and Bi2212, there is a small amount of residual Pb, Bi and Cu that forms a liquid phase during subsequent sinter forging, and also residual Sr, Ca and Cu that forms solid phases such as $(Sr,Ca)_2CuO_3$, $(SrCa)_{14}Cu_{24}O_{38}$, and CuO. It is important that the nonsuperconducting Sr-Ca-Cu-O phases be kept as small and fine as possible, since the phases can disrupt paths for electrical current and prevent superconducting Bi2223 grains from aligning well during the forging. The step of vibratory ball-milling addresses this problem by reducing the grain size of the nonsuperconducting phases, On the other hand, during sinter forging, the liquid phase is actually beneficial for producing of Bi2223 superconductors with good superconducting properties. After sintering, the liquid ultimately solidifies into dark Bi, Pb and Cu rich solids. Evidence of the liquid phase is shown in FIGS. 2a–2c, where micrographs of the top (FIG. 2a), middle (FIG. 2b) and bottom (FIG. 2c) portions of the Bi2223 superconductor shows the percolation of the liquid (indicated by dark spots) downward during forging. It is believed that during sinter forging, the liquid increases atomic motion and helps the superconducting grains to bond effectively. In addition, the liquid reacts with the nonsuperconducting solids to form additional Bi2223 superconducting material. Based on experience, the optimal amount of all non-Bi2223 phase, including the liquid phase, should be at least 1%, but no greater than 10%.

The above described step of vibratory ball-milling, by increasing the phase purity of the Bi2223 powder and reducing the grain size of nonsuperconducting phases, is able to significantly increases the $J_c$ of the Bi2223 superconductor. It has been found that with milling, $J_c$ of about 8000 A/cm$^2$ could be obtained at 77 K, while without milling $J_c$ of only about 2000 A/(cm$^2$ could be obtained. The milling time is important, since at less than one hour insufficient reduction of the nonsuperconducting phases takes place, and at greater than 4 hours the Bi2223 powder can begin to decompose and contamination from the milling media can become an appreciable factor. After calcination, x-ray diffraction analysis revealed that the powder synthesized according to the method as describe herein was about 95% Bi2223.

Once the Bi2223 powder with the desired phase purity is synthesized, it is then formed into bars by cold pressing. To obtain optimal superconducting properties, the cold pressed bars should be between 60–90% dense, providing partial but not complete alignment of the powder grains. Lower densities give rise to poor dimensional tolerances for the final bars, while higher densities limit the ability of the grains to rotate during sinter forging to reduce final grain alignment and reduce accordingly the superconducting properties of the resulting bars. In the embodiment described herein, the Bi2223 powder is cold pressed into bars by uniaxial pressing at 70 MPa in a steel die and by isostatic pressing at 70–80 MPa.

Figure 3:
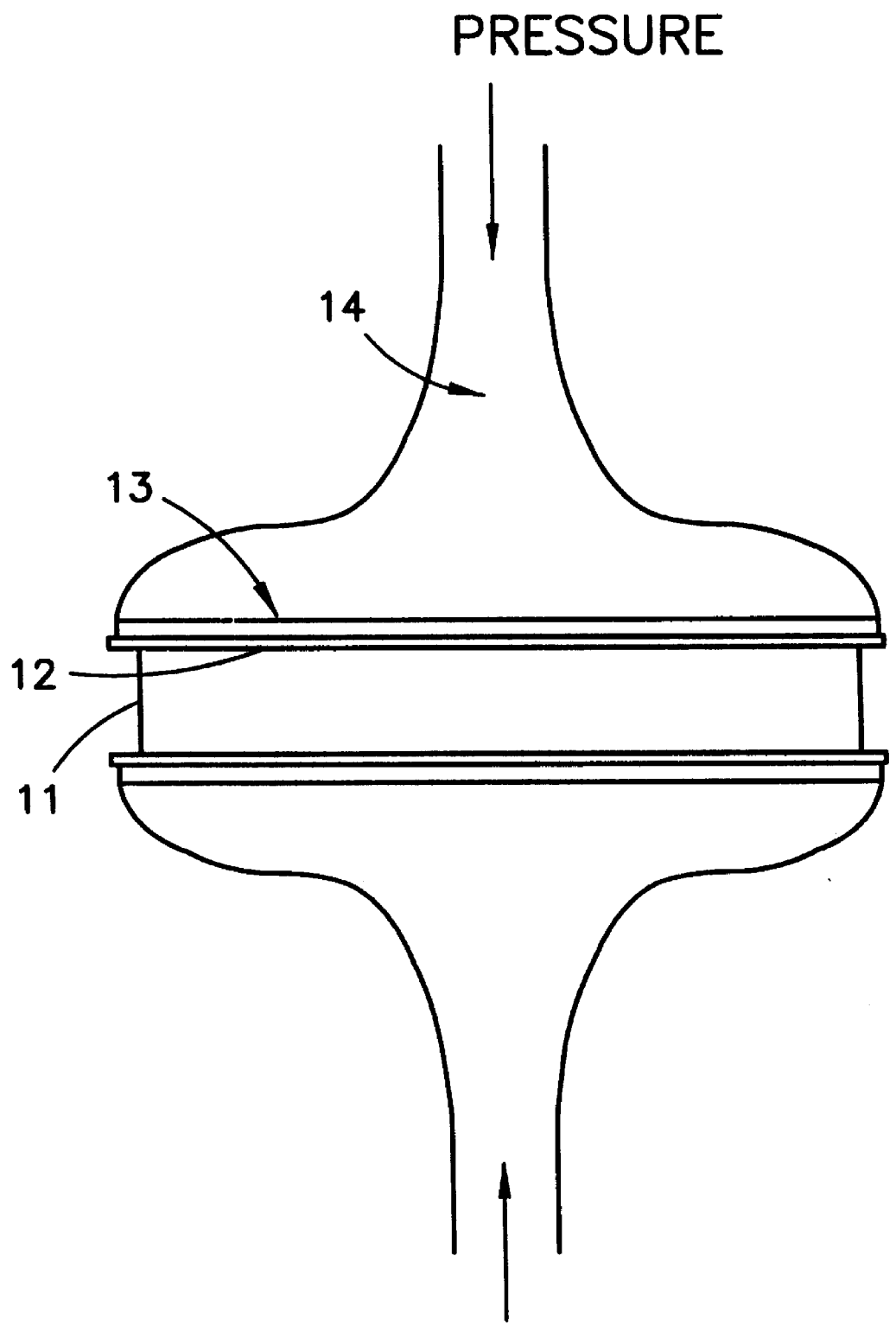
FIG. 3 is a cross-sectional, schematic view of the Bi2223 superconductor being sinter forged.

As shown in FIG. 3, the cold pressed bars 11 are further processed by sinter forging in air at between 840° C. and 848° C. The temperature range, as specified, is crucial for controlling the extent and viscosity of the liquid phase. Since the liquid phase is beneficial for grain alignment and bonding of the Bi2223 powder, as well as further in situ formation of Bi2223, controlling and maintaining the liquid phase is critical for obtaining a Bi2223 superconductor with good superconducting properties. Bi2223 superconductors formed outside of the specified sinter forging temperature will not have as high a $J_c$ as that formed within the temperature range.

The stress on each bar should be between 1 MPa and 6 MPa, with the sinter forging time between 2 and 10 hours. This time restriction is important as shorter times do not allow sufficient grain rotation during compaction and promotes, instead, grain fracturing, while longer times cause too much grain joining prior to grain rotation and result in grain fracture during compaction. Processing or sinter forging outside of this specified time range produced a 50% reduction in the $J_c$ of the final Bi2223 superconductor.

Prior to sinter forging and as shown in FIG. 3, clean silver (Ag) foil 12 is placed between the Bi2223 bar 11 and the ceramic surface 13 of the compression rams 14. The Ag foil 12 not only protects the Bi2223 bar 11 from unwanted chemical reactions, but also, in the final product, serves as excellent low-resistance electrical contacts for passing electricity through the Bi2223 bar 11. The electrical contacts as described herein, have resistivities of less than 1 $\mu\Omega$/cm$_2$ and can carry at least 750 A of DC current and allows the Bi2223 superconductor to be connected directly to an electrical power system without the need for additional processing to form adequate contacts.

After sinter forging, the Bi2223 superconductor is cooled at a rate between 60° C./hour and 300° C./hour. The specified cooling rate is important, since slower rates allow for further grain growth which can lead to about a 10–20% reduction in $J_c$ while faster rates can cause thermal shock which may result in microcracking. Additionally, after sinter forging, it is also important that the Bi2223 superconductor not be subjected to thermal treatment above 500° C. without the application of pressure. Such high temperature post treatment can decrease the $J_c$ of the superconductor by 10–20% from possible further grain growth or thermal shock leading to microcracking.

The method of the invention described herein produces a dense, phase pure, highly textured Bi2223 superconductors with excellent superconducting and mechanical properties. Final densities of the superconductors obtained by the method of the invention are typically greater than 88%, although densities of 95% or greater have been achieved. Mechanically, the strength of the Bi2223 superconducting bars has reached 150 MPa, with a fracture toughness of 3.0 MPa(m)$^{0.5}$. In contrast, conventional Bi2223 superconductors normally have strength of only 110 MPa and fracture toughness of 1.5–2.0 MPa(m)$^{0.5}$. As a result, final annealing, which generally takes longer than 100 hours, is unnecessary as the process disclosed herein produces Bi2223 superconductors with excellent $J_c$, and structural stability without annealing.

The foregoing description of a preferred embodiment of the invention has been presented for purposes of illustration and description. It is not intended to be exhaustive or to limit the invention to the precise form disclosed. For example, the step of vibratory ball-milling may be modified into two or even three shorter steps, so long as the effect of reducing nonsuperconducting phases and producing a more phase pure Bi2223 powder can be accomplished. The embodiment described herein explains the principles of the invention so that others skilled in the art may practice the invention in various embodiments and with various modifications as suited to the particular use contemplated. It is intended that the scope of the invention be defined by the claims appended hereto.

The embodiments of this invention in which an exclusive property or privilege is claimed are defined as follows:

1. A method of manufacturing a high temperature (Bi,Pb)$_2$Sr$_2$Ca$_2$Cu$_3$O$_x$ (Bi2223) superconductor with high J$_c$ and mechanical strength, comprising the steps of:

preparing a mixture of Bi$_2$O$_3$, PbO, SrCO$_3$, CaCo$_3$ and CuO;

conducting a first milling of the mixture;

conducting a first calcination of the milled mixture;

conducting a second milling of the calcined mixture;

conducting a second calcination of the twice milled, calcined mixture to synthesize Bi2223 powder containing between 1–10 atomic percent nonsuperconducting, non-Bi2223 phase, comprising Pb, Bi and Cu, which form a liquid phase during sinter forging;

cold pressing the Bi2223 powder to a predetermined density; and sinter forging the cold pressed powder to form a Bi2223 superconductor.

2. The method of claim 1 including the step of placing a silver foil on the cold pressed powder to prevent unwanted chemical reaction during sintering and to form a low resistance electrical contact on the superconductor.

3. The method of claim 1 including the step of cooling the sinter forged superconductor at a rate between 60–300° C./hour.

4. The method of claim 1 wherein the sinter forging is conducted at a temperature between 840–848° C.

5. The method of claim 1 wherein the sinter forging is conducted for a duration between 2–10 hours.

6. The method of claim 1 wherein the sinter forging is conducted at a pressure between 1–6 MPa.

7. The method of claim 1 wherein the Bi2223 powder is cold pressed to a density between 60–90%.

8. The method of claim 1 wherein the cold pressing includes uniaxial pressing and isostatic pressing.

9. The method of claim 1 wherein the second milling is conducted for a duration between 14 hours.

10. The method of claim 1 wherein the second milling includes vibratory ball-milling.

11. The method of claim 1 wherein the first calcination is conducted for 50 hours at 840° C.

12. The method of claim 1 wherein the second calcination is conducted for 50 hours at 855° C.

13. The method of claim 1 wherein the first milling is conducted for 16 hours.

14. A method of manufacturing a high temperature (Bi,Pb)$_2$Sr$_2$Ca$_2$Cu$_3$O$_x$ (Bi2223) superconductor with high J$_c$ and mechanical strength, and having silver electrical contacts, comprising the steps of:

preparing a mixture of Bi$_2$O$_3$, PbO, SrCO$_3$, CaCo$_3$ and CuO;

conducting a first milling of the mixture;

conducting a first calcination of the milled mixture;

conducting a second milling of the calcinated mixture for 1–4 hours;

conducting a second calcination of the twice milled, calcined mixture to synthesize Bi2223 powder containing between 1–10 atomic percent nonsuperconducting. non-Bi2223 phase, comprising Pb, Bi and Cu, which form a liquid phase during sinter forging;

cold pressing the Bi2223 powder to a density between 60–90%;

placing a silver foil on the cold pressed powder to prevent unwanted chemical reaction during sinter forging and to form a low resistance electrical contact directly on the superconductor;

sinter forging the cold pressed powder for 2–10 hours at 840°–848° C. to form a superconductor; and cooling said sinter forged superconductor at a rate between 60°–300° C./hour.

15. A method of manufacturing a high temperature (Bi,Pb)$_2$Sr$_2$Ca$_2$Cu$_3$O$_x$ (Bi2223) superconductor with high J$_c$ and mechanical strength, comprising the steps of:

preparing a mixture of Bi$_2$O$_3$, PbO, SrCO$_3$, CaCo$_3$ and CuO;

conducting a first milling of the mixture;

conducting a first calcination of the milled mixture;

conducting a second milling of the calcined mixture;

conducting a second calcination of the twice milled, conducting a second calcination of the twice milled, calcined mixture to synthesize Bi2223 powder containing between 1–10 atomic percent nonsuperconducting, non-Bi2223 phase, comprising Pb, Bi and Cu;

cold pressing the Bi2223 powder to a predetermined density; and sinter forging the cold pressed powder to liquify said nonsuperconducting, non-Bi2223 phase comprising Pb, Bi and Cu, and form a Bi2223 superconductor.

16. A method of manufacturing a high temperature (Bi,Pb)$_2$Sr$_2$Ca$_2$Cu$_3$O$_x$ (Bi2223) superconductor with high J$_c$ and mechanical strength, comprising the steps of:

preparing a mixture of Bi$_2$O$_3$, PbO, SrCO$_3$, CaCo$_3$ and CuO;

milling and calcining the mixture to synthesize Bi2223 powder containing between 1–10 atomic percent non-superconducting phase, comprising Pb, Bi and Cu; cold pressing the Bi2223 powder to a predetermined density; and sinter forging the cold pressed powder to form a Bi2223 superconductor.

17. The method of claim 16 wherein said 1–10 atomic percent nonsuperconducting phase forms a liquid phase during sinter forging.

* * * * *